(12) United States Patent
Shin

(10) Patent No.: US 9,036,445 B1
(45) Date of Patent: May 19, 2015

(54) SEMICONDUCTOR DEVICES

(71) Applicant: SK hynix Inc., Icheon-si Gyeonggi-do (KR)

(72) Inventor: Tae Kyun Shin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/174,719

(22) Filed: Feb. 6, 2014

(51) Int. Cl.
*G11C 11/418* (2006.01)
*G11C 17/16* (2006.01)
*G11C 17/18* (2006.01)
*G11C 5/14* (2006.01)

(52) U.S. Cl.
CPC ............... *G11C 17/16* (2013.01); *G11C 17/18* (2013.01); *G11C 5/148* (2013.01)

(58) Field of Classification Search
CPC .......................................... G11C 5/148
USPC ............................ 365/96, 229, 200
See application file for complete search history.

(56) References Cited

U.S. PATENT DOCUMENTS 6,584,032 B2 * 6/2003 Fujioka et al. ............... 365/227
6,791,894 B2 * 9/2004 Nagai et al. .................. 365/226
2003/0081461 A1 5/2003 Yamauchi et al.
2008/0279017 A1 * 11/2008 Shimano et al. ......... 365/189.06
2010/0109723 A1 * 5/2010 Shin ............................ 327/143

FOREIGN PATENT DOCUMENTS

KR 1020120115862 A 10/2012

* cited by examiner

*Primary Examiner* — Hoai V Ho
*Assistant Examiner* — Jay Radke
(74) *Attorney, Agent, or Firm* — William Park & Associates Ltd.

(57) ABSTRACT

The semiconductor device includes a power source signal generator and a redundancy signal generator. The power source signal generator generates a fuse power source signal driven to have a target level of an internal voltage signal. The fuse power source signal is generated to have a lower level than the target level of the internal voltage signal by a certain level during a period from a moment that a deep power-down mode starts till a moment that a level of the internal voltage signal reaches a predetermined level after termination of the deep power-down mode. The redundancy signal generator latches a fuse data in response to a fuse reset signal and a fuse set signal to generate a redundancy signal while the fuse power source signal is supplied.

18 Claims, 4 Drawing Sheets

SEMICONDUCTOR DEVICES

BACKGROUND

1. Technical Field

Embodiments of the present disclosure generally relate to semiconductor devices and more particularly to semiconductor devices including a power source signal generator and a redundancy signal generator.

2. Related Art

Semiconductor devices may be regarded as failed devices if at least one of the memory cells included in each of the semiconductor devices abnormally operates. As the semiconductor devices become more highly integrated, the number of the failed devices has been continuously increased. Thus, the semiconductor devices may be designed to include redundancy cells. That is, if the semiconductor device has abnormal memory cells, a repair operation may be executed to replace the abnormal memory cells with the redundancy cells. The semiconductor device may store information on the abnormal memory cells therein to execute the repair operation.

Each of the semiconductor devices may be designed to include fuses that store information necessary for various internal control operations, for example, the information on the abnormal memory cells. General fuses can be programmed in a wafer level because a logic level of each data is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a nonvolatile memory (NVM) cell transistor having a floating gate or a charge trapping layer. In such a case, a data may be stored in the e-fuse by programming or erasing the transistor to change a threshold voltage of the transistor. That is, the e-fuse may be electrically open or short according to a resistance value between a source and a drain of the transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations. In the event that the e-fuse arrays are employed in the semiconductor devices, the e-fuse arrays may share the amplifiers with each other. Accordingly, the integration density of the semiconductor devices may be improved.

SUMMARY

Various embodiments are directed to semiconductor devices.

According to some embodiments, a semiconductor device includes a power source signal generator and a redundancy signal generator. The power source signal generator generates a fuse power source signal driven to have a target level of an internal voltage signal. The fuse power source signal is generated to have a lower level than the target level of the internal voltage signal by a certain level during a period from a moment that a deep power-down mode starts till a moment that a level of the internal voltage signal reaches a predetermined level after termination of the deep power-down mode. The redundancy signal generator latches a fuse data in response to a fuse reset signal and a fuse set signal to generate a redundancy signal while the fuse power source signal is supplied.

According to an embodiment, a semiconductor device includes: a power source signal generator suitable for generating a fuse power source signal driven to have a target level of an internal voltage signal, the fuse power source signal being generated to have a lower level than the target level of the internal voltage signal by a certain level during a period from a moment that a deep power-down mode starts till a moment after termination of the deep power-down mode; and a redundancy signal generator suitable for latching a fuse data in response to a fuse reset signal and a fuse set signal to generate a redundancy signal while the fuse power source signal is supplied.

BRIEF DESCRIPTION OF THE DRAWINGS

Embodiments of the present invention will become more apparent in view of the attached drawings and accompanying detailed description, in which.

DETAILED DESCRIPTION

Embodiments of the present invention will be described hereinafter with reference to the accompanying drawings. However, the embodiments described herein are for illustrative purposes only and are not intended to limit the scope of the invention.

Figure 1:
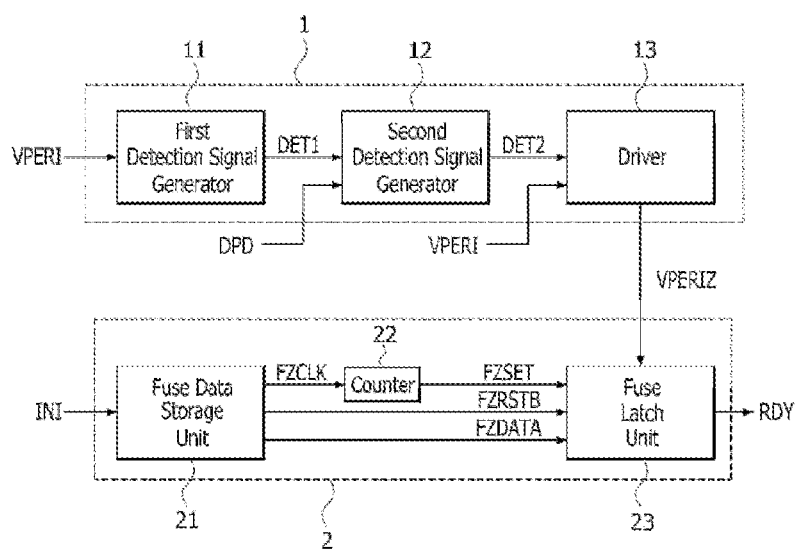
FIG. 1 is a block diagram illustrating a semiconductor device according to some embodiments of the present invention.

Referring to FIG. 1, a semiconductor device according to some embodiments may include a power source signal generator 1 and a redundancy signal generator 2. The power source signal generator 1 may include a first detection signal generator 11, a second detection signal generator 12 and a driver 13. The redundancy signal generator 2 may include a fuse data storage unit 21, a counter 22 and a fuse latch unit 23.

The first detection signal generator 11 may detect a level of an internal voltage signal VPERI to generate a first detection signal DET1. A level of the first detection signal DET1 may be changed from a logic "low" level to a logic "high" level when a level of the internal voltage signal VPERI increases to reach a predetermined level. The internal voltage signal VPERI may maintain a constant level after a level of the internal voltage signal VPERI reaches a target level VTAR. The predetermined level of the internal voltage signal VPERI may be set to be lower than the target level VTAR.

The second detection signal generator 12 may generate a second detection signal DET2 in response to the first detection signal DET1 and a deep power-down mode signal DPD. The deep power-down mode signal DPD may be enabled to have a logic "high" level in a deep power-down mode. The second detection signal DET2 may be enabled to have a logic "high" level during a period from a moment that the deep power-down mode signal DPD is enabled to have a logic "high" level till a moment that the a level of the first detection signal DET1 is changed from a logic "low" level to a logic "high" level.

The driver 13 may drive a fuse power source signal VPERIZ in response to the second detection signal DET2. The driver 13 may drive the fuse power source signal VPERIZ to have the target level VTAR of the internal voltage signal VPERI while the second detection signal DET2 is disabled to have a logic "low" level. The driver 13 may drive the fuse power source signal VPERIZ to have a lower level than the target level VTAR of the internal voltage signal VPERI by a certain level while the second detection signal DET2 is enabled to have a logic "high" level. The certain level may correspond to a threshold voltage of an MOS transistor (see FIG. 2) included in the driver 13.

The fuse data storage unit 21 may include an e-fuse array (not shown) that stores fuse data FZDATA corresponding to information on abnormal memory cells. The fuse data storage unit 21 may generate and output a fuse reset signal FZRSTB including a pulse in response to an initialization signal INI. The fuse data storage unit 21 may receive the initialization signal INI to generate and output a fuse clock signal FZCLK which is toggled and to output the fuse data FZDATA stored therein. The initialization signal INI may be any one selected from diverse signals according to embodiments. For example, the initialization signal INI may be a power-up signal whose level is changed when the internal voltage signal VPERI reaches a predetermined level or a reset signal which is enabled when an initial operation of the semiconductor device starts.

The counter 22 may output a fuse set signal FZSET that is counted in response to the fuse clock signal FZCLK. The fuse latch unit 23 may generate a redundancy signal RDY in response to the fuse reset signal FZRSTB, the fuse set signal FZSET and the fuse data FZDATA. Although each of the fuse set signal FZSET, the fuse data FZDATA, the fuse reset signal FZRSTB and the redundancy signal RDY is illustrated as a single signal in FIG. 8 for the purpose of ease and convenience in explanation, each of the fuse set signal FZSET, the fuse data FZDATA, the fuse reset signal FZRSTB and the redundancy signal RDY may be realized to include the same number of signals as the memory cells that are replaced with redundancy cells.

Figure 2:
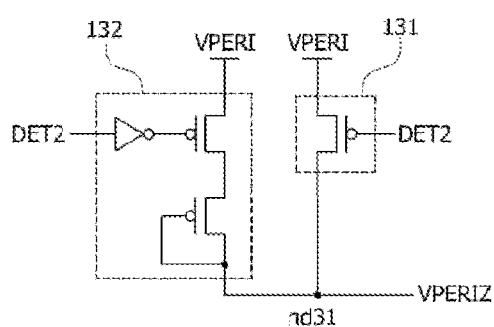
FIG. 2 is a circuit diagram illustrating a driver included in the semiconductor device of FIG. 1.

Referring to FIG. 2, the driver 13 may include a first drive element 131 and a second drive element 132. The first drive element 131 may be realized using a PMOS transistor coupled between the internal voltage signal VPERI terminal and a node ND31. The second drive element 132 may be suitable for including PMOS transistors which are serially connected between the internal voltage signal VPERI terminal and the node ND31 and an inverter which is connected to a gate of the PMOS transistor. The first drive element 131 may drive the fuse power source signal VPERIZ to have the target level VTAR of the internal voltage signal VPERI while the second detection signal DET2 has a logic "low" level. The second drive element 132 may drive the fuse power source signal VPERIZ to have a lower level than the target level VTAR of the internal voltage signal VPERI by a certain level while the second detection signal DET2 has a logic "high" level. This certain level may correspond to a threshold voltage of an PMOS transistor included in the second drive element 132.

Figure 3:
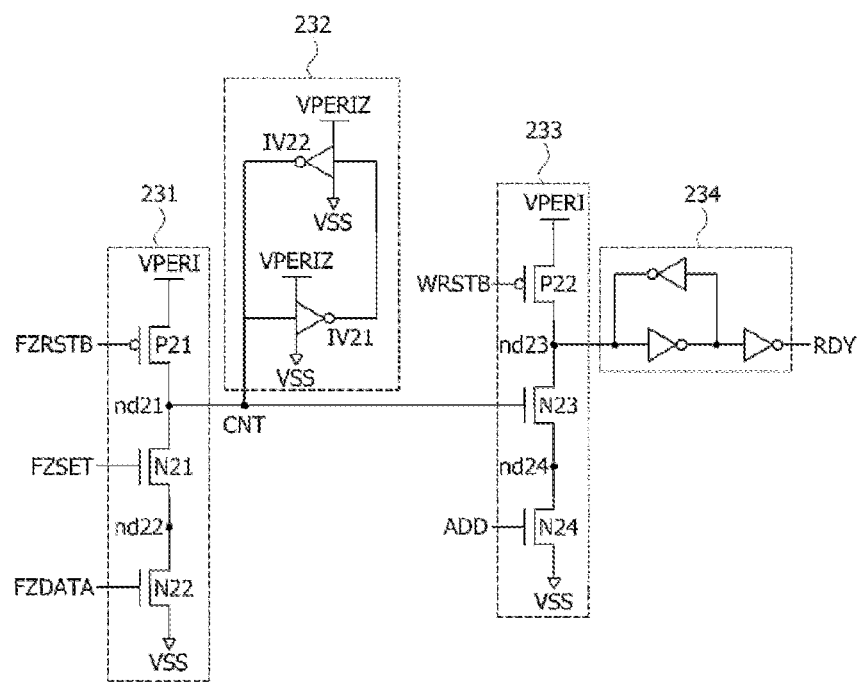
FIG. 3 is a circuit diagram illustrating a fuse latch unit included in the semiconductor device of FIG. 1.

Referring to FIG. 3, the fuse latch unit 23 may include a control signal driver 231, a control signal latch unit 232, an internal driver 233 and a buffer unit 234.

The control signal driver 231 may include a PMOS transistor P21 and NMOS transistors N21 and N22. The PMOS transistor P21 may be coupled between an internal voltage signal VPERI terminal and a node ND21 and may be turned on in response to the fuse reset signal FZRSTB. The NMOS transistor N21 may be coupled between the node ND21 and a node ND22 and may be turned on in response to the fuse set signal FZSET. The NMOS transistor N22 may be coupled between the node ND22 and a ground voltage signal VSS terminal and may be turned on in response to the fuse data FZDATA. The control signal driver 231 may drive a control signal CNT outputted through the node ND21 to have a logic "high" level when a logic "low" level pulse of the fuse reset signal FZRSTB is inputted to the control signal driver 231. The control signal driver 231 may drive the control signal CNT outputted through the node ND21 to have a logic "low" level when a logic "high" level pulse of the fuse set signal FZSET is inputted to the control signal driver 231 and the fuse data FZDATA having a logic "high" level is inputted to the control signal driver 231. The control signal latch unit 232 may latch the control signal CNT and includes inverters IV21 and IV22. Inverters IV21 and IV22 may receive the fuse power source signal VPERIZ and the ground voltage signal VSS to operate.

The internal driver 233 may include a PMOS transistor P22 and NMOS transistors N23 and N24. The PMOS transistor P22 may be coupled between the internal voltage signal VPERI terminal and a node ND23 and may be turned on in response to an initialization signal WRSTB. The NMOS transistor N23 may be coupled between the node ND23 and a node ND24 and may be turned on in response to the control signal CNT. The NMOS transistor N24 may be coupled between the node ND24 and the ground voltage signal VSS terminal and may be turned on in response to an address signal ADD. The internal driver 233 may drive a signal of the node ND23 to have a logic "high" level when a logic "low" level pulse of the initialization signal WRSTB is inputted to the internal driver 233. The internal driver 233 may drive a signal of the node ND23 to have a logic "low" level if the control signal CNT has a logic "high" level while the address signal ADD having a logic "high" level is inputted to the internal driver 233. The buffer 234 may latch a signal of the node ND23 and may buffer the latched signal to generate the redundancy signal RDY.

Figure 4:
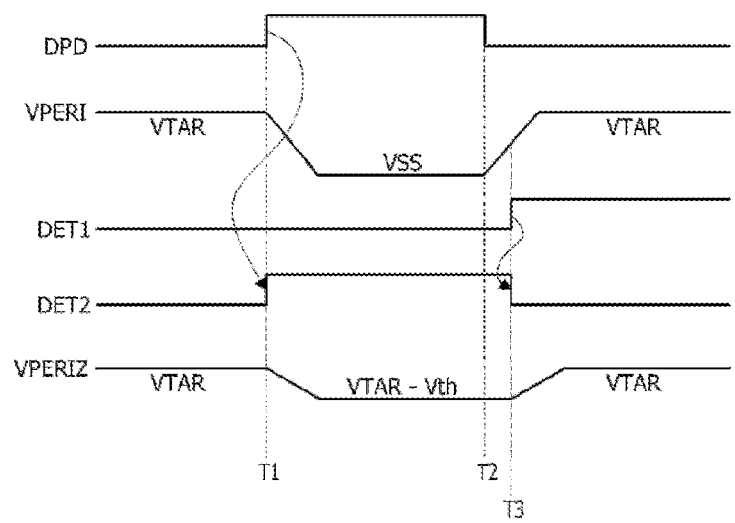
FIG. 4 is a timing diagram illustrating an operation of a semiconductor device according to some embodiments of the present invention.

An operation of the semiconductor devices having the aforementioned configuration will be described hereinafter with reference to FIG. 4.

Before a point of time "T1", both the first and second detection signals DET1 and DET2 may maintain a logic "low" level because the internal voltage signal VPERI has the target level VTAR and the semiconductor device is out of the deep power-down mode. Thus, the fuse power source signal VPERIZ supplied to the fuse latch unit 23 may be driven to have the target level VTAR of the internal voltage signal VPERI.

If the semiconductor device is in the deep power-down mode during a period between the point of time "T1" and a point of time "T2", the a level of internal voltage signal VPERI may be lowered to have a ground voltage VSS. In such a case, because the first detection signal DET1 maintains a logic "low" level and the second detection signal DET2 has a logic "high" level, the fuse power source signal VPERIZ may be driven to have a lower level (VTAR−Vth) than the target level VTAR of the internal voltage signal VPERI by a certain level. The certain level may correspond to a threshold voltage Vth of a MOS transistor (see FIG. 2) included in the driver 13.

If the internal voltage signal VPERI has a lower level than a predetermined level during a period from the point of time "T2" to a point of time "T3" after the semiconductor device exits from the deep power-down mode at the point of time "T2", the second detection signal DET2 may still maintain a logic "high" level because the first detection signal DET1 maintains a logic "low" level. Thus, the fuse power source signal VPERIZ may be still driven to have a lower level (VTAR-Vth) than the target level VTAR of the internal voltage signal VPERI by a certain level during the period between the point of time "T2" and the point of time "T3". The certain level may correspond to a threshold voltage Vth of a MOS transistor (see FIG. 2) included in the driver 13.

If the internal voltage signal VPERI has a higher level than the predetermined level after the point of time "T3", a level of the first detection signal DET1 may be changed from a logic "low" level to a logic "high" level at the point of time "T3". Thus, the second detection signal DET2 may be disabled to have a logic "low" level at the point of time "T3". Accordingly, the fuse power source signal VPERIZ supplied to the fuse latch unit 23 may be driven to have the target level VTAR of the internal voltage signal VPERI.

According to the above embodiments, even though a semiconductor device operates in a deep power-down mode, a fuse power source signal VPERIZ driven to a lower level than a target level VTAR by a certain level may be continuously supplied to a fuse latch unit 23 latching a control signal CNT to prevent the latched data from being lost. Moreover, the fuse power source signal VPERIZ may be supplied to the fuse latch unit 23 until an internal voltage signal VPERI reaches a predetermined level after the semiconductor device exits from the deep power-down mode. Thus, the fuse latch unit 23 may stably latch the control signal CNT not only in the deep power-down mode but also until the internal voltage signal VPERI reaches a predetermined level after the deep power-down mode.

What is claimed is:

1. A semiconductor device comprising:
    a power source signal generator suitable for generating a fuse power source signal driven to have a target level of an internal voltage signal, the fuse power source signal being generated to have a lower level than the target level of the internal voltage signal by a certain level during a period from a moment that a deep power-down mode starts till a moment that a level of the internal voltage signal reaches a predetermined level after termination of the deep power-down mode; and
    a redundancy signal generator suitable for latching a fuse data in response to a fuse reset signal and a fuse set signal to generate a redundancy signal while the fuse power source signal is supplied.

2. The semiconductor device of claim 1, wherein the certain level corresponds to a threshold voltage of a MOS transistor included in the power source signal generator.

3. The semiconductor device of claim 1, wherein the power source signal generator is suitable for detecting the internal voltage signal to generate a first detection signal, suitable for generating a second detection signal in response to the first detection signal and a deep power-down mode signal, and suitable for generating the fuse power source signal from the internal voltage signal in response to the second detection signal.

4. The semiconductor device of claim 3, wherein the power source signal generator includes a first detection signal generator that generates the first detection signal whose level is changed when a level of the internal voltage signal increases to reach the predetermined level.

5. The semiconductor device of claim 4, wherein the power source signal generator further includes a second detection signal generator that generates the second detection signal which is enabled during a period from a moment that the deep power-down mode signal is enabled till a moment that a level transition of the first detection signal occurs.

6. The semiconductor device of claim 5, wherein the power source signal generator further includes a driver which is suitable for driving the fuse power source signal to have the target level of the internal voltage signal while the second detection signal is disabled and suitable for driving the fuse power source signal to have a lower level than the target level of the internal voltage signal by a certain level while the second detection signal is enabled.

7. The semiconductor device of claim 6, wherein the certain level corresponds to a threshold voltage of a MOS transistor included in the driver.

8. The semiconductor device of claim 5, wherein the power source signal generator further includes:
    a first drive element suitable for receiving the internal voltage signal and the second detection signal and drive the fuse power source signal to have the target level of the internal voltage signal while the second detection signal is disabled; and
    a second drive element suitable for receiving the internal voltage signal and the second detection signal and drive the fuse power source signal to have a lower level than the target level of the internal voltage signal by a certain level while the second detection signal is enabled.

9. The semiconductor device of claim 1, wherein the redundancy signal generator includes a fuse latch unit that generates the redundancy signal for determining whether a memory cell accessed by an address signal has to be replaced with a redundancy cell according to a level of the fuse data at a point of time that a pulse of the fuse set signal is created.

10. The semiconductor device of claim 9, wherein the fuse latch unit includes:
    a control signal driver suitable for driving a control signal in response to the fuse reset signal, the fuse set signal and the fuse data;
    a control signal latch unit suitable for receiving the fuse power source signal to latch the control signal;
    an internal driver suitable for driving an internal node in response to the control signal, the address signal and an initialization signal; and
    a buffer unit suitable for buffering a signal of the internal node to generate the redundancy signal.

11. The semiconductor device of claim 1, wherein the redundancy signal generator further includes a fuse data storage unit that generates a fuse clock signal, the fuse reset signal and the fuse data in response to an initialization signal.

12. The semiconductor device of claim 11, wherein the initialization signal is generated by detecting a level of the internal voltage signal.

13. The semiconductor device of claim 12, wherein the initialization signal includes a power-up signal whose level is changed when the internal voltage signal reaches a predetermined level.

14. The semiconductor device of claim 12, wherein the initialization signal includes a reset signal which is enabled when an initial operation of the semiconductor device starts.

15. The semiconductor device of claim 11, wherein the fuse data storage unit includes a fuse array that stores the fuse data.

16. The semiconductor device of claim 15, wherein the fuse data corresponds to information on abnormal memory cells.

17. The semiconductor device of claim 11, wherein the redundancy signal generator further includes a counter outputting the fuse set signal that is counted in response to the fuse clock signal.

18. A semiconductor device comprising:
- a power source signal generator suitable for generating a fuse power source signal driven to have a target level of an internal voltage signal, the fuse power source signal being generated to have a lower level than the target level of the internal voltage signal by a certain level during a period from a moment that a deep power-down mode starts till a moment after termination of the deep power-down mode; and
- a redundancy signal generator suitable for latching a fuse data in response to a fuse reset signal and a fuse set signal to generate a redundancy signal while the fuse power source signal is supplied.

\* \* \* \* \*